US006762500B2

(12) United States Patent
Ahn et al.

(10) Patent No.: US 6,762,500 B2
(45) Date of Patent: Jul. 13, 2004

(54) BARRIER-METAL-FREE COPPER DAMASCENE TECHNOLOGY USING ATOMIC HYDROGEN ENHANCED REFLOW

(75) Inventors: Kie Y. Ahn, Chappaqua, NY (US); Leonard Forbes, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/122,870

(22) Filed: Apr. 15, 2002

(65) Prior Publication Data

US 2002/0130419 A1 Sep. 19, 2002

Related U.S. Application Data

(62) Division of application No. 09/809,670, filed on Mar. 15, 2001, now Pat. No. 6,696,360.

(51) Int. Cl.[7] ............................................. H01L 23/48
(52) U.S. Cl. ........................ 257/760; 257/751; 257/762
(58) Field of Search ............................... 257/750, 752, 257/759, 760, 762, 751

(56) References Cited

U.S. PATENT DOCUMENTS

| 4,944,961 A | | 7/1990 | Lu et al. ................. 427/38 |
| 4,990,464 A | * | 2/1991 | Baumgart et al. ............ 117/43 |
| 5,024,722 A | | 6/1991 | Cathey, Jr. ................. 156/643 |
| 5,235,199 A | * | 8/1993 | Hamamoto et al. ......... 257/306 |
| 5,250,467 A | | 10/1993 | Somekh et al. |
| 5,302,266 A | | 4/1994 | Grabarz et al. ........ 204/192.12 |
| 5,654,232 A | * | 8/1997 | Gardner ..................... 438/661 |
| 5,789,317 A | | 8/1998 | Batra et al. ................. 438/642 |
| 5,821,168 A | | 10/1998 | Jain ........................... 438/692 |
| 5,920,121 A | | 7/1999 | Forbes et al. ............... 257/742 |
| 5,980,657 A | | 11/1999 | Farrar et al. ................. 148/438 |
| 5,985,759 A | | 11/1999 | Kim et al. .................. 438/653 |
| 5,994,778 A | | 11/1999 | Huang et al. |
| 6,015,323 A | | 1/2000 | Moradi et al. ................ 445/24 |
| 6,016,000 A | | 1/2000 | Moslehi |
| 6,037,248 A | | 3/2000 | Ahn ........................... 438/619 |
| 6,037,258 A | | 3/2000 | Liu et al. .................... 438/687 |
| 6,097,242 A | | 8/2000 | Forbes et al. ............... 327/537 |
| 6,134,175 A | | 10/2000 | Forbes et al. .......... 365/230.06 |
| 6,137,167 A | | 10/2000 | Ahn et al. .................. 257/691 |
| 6,149,829 A | * | 11/2000 | Takamatsu et al. ........... 216/67 |
| 6,153,522 A | | 11/2000 | Takagi et al. |
| 6,211,073 B1 | | 4/2001 | Ahn et al. |
| 6,274,923 B1 | * | 8/2001 | Mikagi ...................... 257/642 |
| 6,335,273 B2 | | 1/2002 | Huang et al. |
| 6,383,911 B2 | | 5/2002 | Mikagi |

OTHER PUBLICATIONS

J. Hopwood, *Ionized Physical Vapor Deposition of Integrated Circuit Interconnects*, Physics of Plasmas, vol. 5, No. 5, pp. 1624–1631, May, 1998.

S.M. Rossnagel, *Sputter Deposition for Semiconductor Manufacturing*, http://www.research.ibm.com/journal/rd/431/rossnagel.txt.

Ryan, James G., et al., *Copper Interconnects for Advances Logic and DRAM*, Extended Abstracts of the 1998 International Conference on Solid State Devices and Materials, 1998, pp. 258–259.

(List continued on next page.)

Venkatesan, S., et al., *A High Performance 1.8V, 0.20 μm CMOS Technology with Copper Metallization*, IEEE, 1997, pp. 769–772.

Primary Examiner—Matthew Smith
Assistant Examiner—Lex H. Malsawma
(74) Attorney, Agent, or Firm—Whyte Hirschboeck Dudek SC

(57) ABSTRACT

A method for forming conductive contacts and interconnects in a semiconductor structure, and the resulting conductive components are provided. In particular, the method is used to fabricate single or dual damascene copper contacts and interconnects in integrated circuits such as memory devices and microprocessor.

94 Claims, 5 Drawing Sheets

OTHER PUBLICATIONS

Hirata, A., et al., *WsiN Diffusion Barrier Formed by ECR Plasma Nitridation for Copper Damascene Interconnection*, Extended Abstracts of the 1998 International Conference on Solid State Devices and Materials, 1998, pp. 260–261.

Rossnagel, S.M., et al., *Metal Ion Deposition from Ionized Mangetron Sputtering Discharge*, J. Vac. Sci. Technol. B 12(1), Jan./Feb. 1994, pp. 449–453.

Miyake, et al., *Atomic Hydrogen Enhanced Reflow of Copper*, Appl. Phys. Lett., vol. 70, No. 10, Mar., 10, 1997, pp. 1239–1241.

Saito, Yuji, et al., *High–Integrity Silicon Oxide Grown at Low–Temperature by Atomic Oxygen Generated in High–Density Krypton Plasma*, Extended Abstracts of the 1999 International Conference on Solid State Devices and Materials, 1999, pp. 152–153.

Dejule, Ruth, *Dual–Damascene: Overcoming Process Issues*, Cahners Semiconductor International, www.semiconductor–intl.com/seniconductor/issues/issues (2000).

Edelstein, D., et al., *Full Copper Wiring in a Sub–0.25 µm CMOS ULSI Technology*, IBM Semiconductor Research and Development Center, Technical Digest of 1997 IEDM, pp. 772–776 (1997).

Mikagi, K., et al., *Barrier Metal Free Copper Damascene Interconnection Technology Using Atmospheric Copper Reflow and Nitrogen Doping in SiOF Film*, ULSI Device Development Laboratories, NEC Corporation, Technical Digest of 1996 IEDM, pp. 465–368 (1996).

Nakao, S., et al., *Thin and Low–Resistivity Tantalum Nitride Diffusion Barrier and Giant–Grian Copper Interconnects for Advanced ULSI Metallization*, Department of Electronic Engineering, Tohoku University, Extended Abstracts of 1998 International Conference on Solid State Devices and Materials, pp. 262–263 (1968).

* cited by examiner

FORM INTERCONNECT TRENCH AND VIA OPENING
THROUGH INSULATING LAYER (e.g., SiOF)
TO UNDERLYING COPPER INTERCONNECT

FORM NITRIDED BARRIER LAYER (e.g., SiON)
OVER EXPOSED SURFACES
OF INSULATING LAYER (E.G., SiOF)

DEPOSIT COPPER BY SPUTTERING

REFLOW COPPER AT LOW TEMPERATURE
IN ATOMIC HYDROGEN FROM $Kr/H_2$ SOURCE

POLISH COPPER TO FORM INTERCONNECT

BARRIER-METAL-FREE COPPER DAMASCENE TECHNOLOGY USING ATOMIC HYDROGEN ENHANCED REFLOW

CROSS-REFERENCE TO RELATED APPLICATIONS

This application is a division of U.S. patent application Ser. No. 09/809,670, filed Mar. 15, 2001 now U.S. Pat. No. 6,696,360.

FIELD OF THE INVENTION

The invention relates generally to semiconductor devices, and more particularly to interconnections within semiconductor circuits and methods of making the interconnections, including methods for fabricating copper interconnects.

BACKGROUND OF THE INVENTION

Integrated circuits are interconnected networks of resistors, transistors and other electrical components that are generally formed on a silicon substrate or wafer with conductive, insulative and semiconductive materials. Fabricating integrated circuits involves forming electrical components at a number of layers and different locations. The various components are then wired or interconnected together to form a memory or other electric circuit. Typically, the components are connected together by interlayer contact openings or vias formed through a dielectric layer to an underlying component and by conductive lines formed in trenches in the dielectric layer that extend from the via to one or more other vias in the layer. The trenches and vias are typically filled with aluminum, tungsten, copper, gold, silver, polysilicon, or other suitable conductive material.

The never-ending miniaturization of integrated circuits (IC) is leading to denser and finer pitched chips with ever increasing speed and performance. In order to enhance the performance of advanced integrated circuits, the interconnect systems are gradually migrating from aluminum-based metallurgy to higher-conductivity and more electromigration-resistant copper.

Of the several schemes proposed for fabricating copper interconnects, the most promising method appears to be the damascene process. In a single damascene process, channels or trenches are etched into the dielectric layer, and a metal is deposited to fill the etched trenches forming an interconnect line. In a dual damascene process, both the via and trenches are etched in the dielectric layer overlying an underlying interconnect or trace. The desired metal is then deposited into the trenches and holes in one step to form a dual damascene structure. Chemical mechanical polishing (CMP) is used to remove the unwanted surface metal, while leaving the desired metal in the trenches and holes, thus forming in-laid interconnect lines and vias that are coupled to electrical components beneath the insulation layer. The CMP processing leaves a planarized surface for subsequent metallization to build multi-level interconnections.

The introduction of copper conductors in integrated circuits has received wide publicity. Copper interconnect is the most promising metallization scheme for future generation high-speed ULSI, primarily because of lower electrical resistivity (1.7 vs. 2.3 $\mu\Omega cm$) and more electro/stress-migration resistance than the conventional aluminum-based materials. Full, 6-level copper wiring has now been introduced in a sub-0.25 $\mu m$ CMOS ULSI technology. However, copper atoms can easily diffuse through most oxides into the devices in the underlying silicon substrate and act as recombination centers to spoil device performance. Copper also diffuses into commonly used dielectric materials (i.e., $SiO_2$) and certain polymers, resulting in conductivity of these insulators and higher effective dielectric constants.

Based on the foregoing, a suitable diffusion barrier is needed in order to adopt copper interconnects for ULSI. A variety of barrier materials such as tantalum (Ta), tantalum silicon nitride (TaSiN), titanium nitride (TiN), tantalum nitride (TaN) and tungsten nitride (WN) have been investigated.

These barrier films are generally deposited by sputtering to a thickness range of 20 to 30 nm and higher. If the barrier thickness does not scale with the device (and wiring scaling), the impact on electrical resistance is significant. The resistance increase due to liner (diffusion barrier) thickness becomes substantial for line widths of approximately 0.2 $\mu m$ and below. It has been reported that a very thin (<6 nm) tungsten silicon nitride (WSiN) layer formed by electron cyclotron resonance (ECR) plasma nitridation of sputtered WSi film prevented copper diffusion.

A barrier metal free copper damascene interconnection technology has been reported. The scheme involved formation of a thin barrier layer on the surface of silicon oxyfluoride (SiOF) film by ammonia ($NH_3$) plasma treatment. The reflow of copper was then performed at 400° C. in atmospheric gas composed of $N_2/H_2$.

It would be desirable to provide a process for the formation of conductive contacts and interconnect lines that eliminates the need for depositing a metal barrier diffusion layer and results in a conductive contact/interconnect that has a higher purity and a lower resistivity compared to prior art films and contact structures.

SUMMARY OF THE INVENTION

The present invention provides methods for forming conductive contacts in a semiconductor structure, and the conductive components formed by those methods. In particular, the method is used to fabricate copper contacts and interconnects in integrated circuits such as memory devices. The method can be used to form single or dual damascene copper interconnects and vias in the manufacture of integrated circuits.

The method of the invention involves forming a conductive component in a semiconductor device. In one embodiment, the method comprises providing a substrate with an overlying insulating layer that includes at least one opening formed therein. A non-metal barrier layer is formed over the insulating layer, including over the sidewalls and bottom portion or base of the opening, by exposing the insulating layer to a nitrogen-containing plasma, preferably ammonia ($NH_3$), to transform the exposed surface of the insulating layer to the barrier layer, preferably to a thickness of about 5 nm to about 10 nm to prevent diffusion of the conductive material into the insulating layer. In a preferred embodiment, the insulating layer comprises silicon oxyfluoride (SiOF), and the barrier layer comprises silicon oxynitride (SiON). A conductive material (i.e., copper) is directionally deposited into the opening, preferably by ionized magnetron sputtering. To ensure filling of the opening, the conductive material is then reflowed at a temperature of less than about 400° C., preferably at a temperature of about 300 to about 350° C., in the presence of atomic hydrogen that is preferably generated using a microwave-excitation high density plasma system using a krypton/hydrogen plasma. After depositing the conductive layer, excess conductive material is removed, preferably by chemical-mechanical polishing, to form the conductive contact in the opening. The method is useful for forming a contact to a semiconductor component underlying the insulating layer on a substrate, for fabricating a semiconductor circuit and an integrated circuit.

In another embodiment, the method can be used to form a dual damascene conductive structure in a semiconductor device by providing a substrate comprising a semiconductor component and an insulating layer over the semiconductor component, and etching the insulating layer to form a channel corresponding to a trench along the insulating layer, and an opening extending from the trench to the semiconductor component. A non-metal barrier layer is formed over the insulating layer including the exposed surface of the channel and the opening, and a conductive material is deposited on the barrier layer by ionized magnetron sputtering to fill the channel and the opening to form dual damascene conductive structures in the insulating layer. The dual damascene structures resulting from the process comprise an interconnect line coupled to a conductive contact to the semiconductor component. The barrier layer prevents diffusion of the copper into the insulating layer Another aspect is a semiconductor circuit resulting from the method of the invention. The semiconductor circuit comprises a semiconductor structure; an insulating layer formed over the semiconductor structure with an opening formed through the insulating layer to the semiconductor structure and/or a horizontal trench opening extending over the insulating layer; a non-metal-comprising barrier layer formed over the insulating layer including the surface of the contact opening and/or the trench opening, which prevents diffusion of a copper-comprising material into the insulating layer; and a conductive contact formed in the contact opening and/or the trench opening over the barrier layer, and coupled to the semiconductor structure. The conductive contact comprises copper sputtered into the contact opening and/or the trench opening and reflowed at a temperature less than about 400° C. in the presence of atomic hydrogen.

In another embodiment, the semiconductor circuit comprises a semiconductor structure; an insulating layer formed over the semiconductor structure and having a plurality of generally vertical contact openings extending therethrough to contact locations on the semiconductor structure, and a plurality of generally horizontal trench openings extending over the insulating layer; each of the contact openings and trench openings having a non-metal barrier layer formed on a surface; a plurality of generally vertical conductive contacts formed through the contact openings and coupled to the semiconductor structure; and a plurality of generally horizontal conductive interconnect lines formed in the trench openings, each of the interconnect lines coupled to at least one generally vertical conductive contact. The conductive contacts and/or the interconnect lines comprise copper deposited by ionized sputtering into the contact opening or the trench opening over the barrier layer and reflowed at a temperature less than about 400° C. in the presence of atomic hydrogen to fill the contact opening and/or the trench opening.

Another aspect is an integrated circuit memory or microprocessor resulting from the method of the invention. The integrated circuit memory or microprocessor comprises an array of memory and/or logic cells, internal circuitry, and conductive contacts and interconnects coupled to the memory or logic arrays and internal circuitry. The metal contacts and interconnects comprise a one or more generally horizontal conductive interconnect lines extending over an insulating layer overlying the memory array, and one or more generally vertical conductive contact, whereby each interconnect line is coupled to at least one generally vertical conductive contact. The conductive interconnect and/or the conductive contact comprises copper deposited by ionized sputtering over a non-metal-comprising barrier layer overlying the surface of a trench opening extending over the insulating layer and/or a contact opening extending vertically into the insulating layer The deposited copper is preferably reflowed at a temperature less than about 400° C. in the presence of atomic hydrogen to fill the trench opening and/or the contact opening. Preferably, the metal contacts and interconnects are formed using a dual damascene process.

Advantageously, the present invention provides higher purity copper contacts and interconnects having a lower resistivity (greater conductivity) compared to prior art copper films and contact structures. The method advantageously eliminates void formation in sub-micron trenches and contact openings, and other high aspect ratio conductive features. The process also eliminates the need to form a separate diffusion barrier by transforming a portion of the insulating layer to form a diffusion barrier film or layer between the metal (copper) contact/interconnect and the insulating layer.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The present invention encompasses methods of making integrated circuits, particularly methods for forming copper contacts and interconnects using a dual damascene process.

The method of the invention will be described generally with reference to the drawings for the purpose of illustrating the present preferred embodiments of the invention only and not for purposes of limiting the same. The figures illustrate processing steps for use in the fabrication of semiconductor devices in accordance with the present invention. It should be readily apparent that the processing steps are only a portion of the entire fabrication process. The present invention particularly deals with the method of fabricating contacts and interconnects that are used in the fabrication of semiconductor devices.

Figure 1:
FIG. 1 is a process flow diagram for an embodiment of the method of the present invention.
Figure 1:
Figure 1:
Figure 1:

FIG. 1 provides a process flow diagram for a first embodiment of the method of the present invention. A semiconductor device is provided that has been processed to where a first level of interconnects have been formed, and an insulating layer has been deposited over the interconnects. The insulating layer is patterned to form a dual inlaid opening that extends to the underlying interconnect. The exposed surfaces of the insulating layer (e.g., SiOF) are then exposed to a nitrogen plasma that converts a portion of the insulating layer into a nitrided oxide film (e.g., SiON) that is a diffusion barrier layer for copper. A copper layer is then deposited, preferably by ionized magnetron sputtering followed by a low temperature reflow process in atomic hydrogen generated by a microwave excited $Kr/H_2$. Excess copper is then removed from high regions by chemical mechanical polishing (CMP), which leaves copper only in the etched features to form the dual inlaid structures that include via and interconnect portions The process is described in more detail with reference to FIGS. 2A–2F. As shown, a dual damascene process is used to form copper contact vias and interconnects associated with a semiconductor circuit. It is-understood that the method of the invention can be used in a single damascene process to form an interconnect and/or a via of an integrated circuit memory or microprocessor.

The interconnects are illustrated and will be described as being coupled to a conductive area 16; however, the interconnects of the present invention can be used wherever required within the structure of a semiconductor circuit.

Figure 2A:
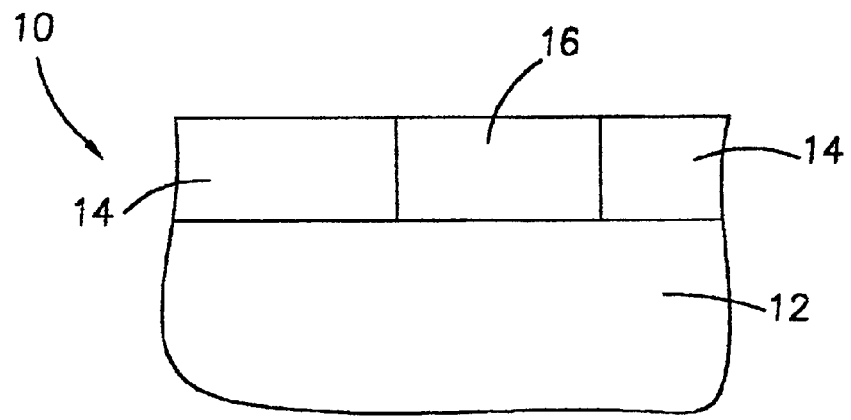
FIG. 2A is a diagrammatic cross-sectional view of a semiconductor wafer fragment at a preliminary step of a processing sequence.

Referring to FIG. 2A, a wafer fragment 10 is shown as including a semiconductor base layer 12, a dielectric or insulating layer 14, and a conductive area 16. The base layer 12 is a semiconductor substrate, for example, a semiconductor wafer substrate or the wafer along with various process layers formed thereon, including one or more semiconductor layers or other formations, and active or operable portions of semiconductor devices. An exemplary base layer 12 is monocrystalline silicon having regions that are p-type or n-type doped. The insulating layer 14, for example, an oxide such as phosphosilicate glass (PSG) or borophosphosilicate glass (BPSG), in a single layer or multiple layers, is formed over the base layer 12, being silicon in the illustrated embodiment. The insulating layer 14 has been etched to provide an opening extending to the base layer 12, and into which a conductive material has been deposited by chemical vapor deposition (CVD) or other suitable method, and planarized, for example, by chemical mechanical polishing (CMP), to form conductive area 16, such as a conductive trace. The conductive area can comprise a conductor or semiconductor material, for example, polysilicon, metal or doped silicon. Preferably, the conductive area comprises copper. The conductive area 16 can be used for connecting power to the semiconductor base layer 12 as part of a semiconductor structure.

Figure 2B:
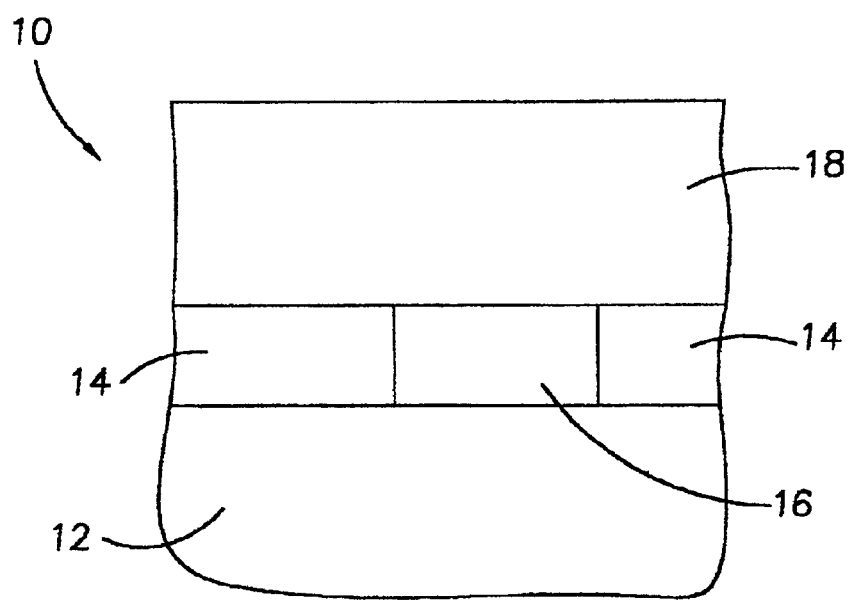
FIGS. 2B–2F are views of the wafer fragment of FIG. 2A at subsequent and sequential processing steps, showing fabrication of a contact via and interconnect line by dual damascene processing according to the method of the invention, depicted in FIG. 1.

Referring to FIG. 2B, a second dielectric or insulating layer 18, in a single layer or multiple layers, is formed over insulating layer 14 and conductive area 16, typically to a thickness of about 4,000 to about 10,000 angstroms (about 400 to about 1000 nm). The second insulating layer 18 can be formed using, for example, tetraethylorthosilicate (TEOS), silicon oxyfluoride (SiOF), low k dielectrics, and the like. A preferred insulating layer 18 comprises SiOF, which has a low dielectric constant of 3.5. An SiOF insulating layer 18 can be formed, for example, by introducing a fluorine species during plasma enhanced chemical vapor deposition (PECVD) of $SiO_2$, or by deposition by electron cyclotron resonance (ECR) CVD.

Figure 2C:
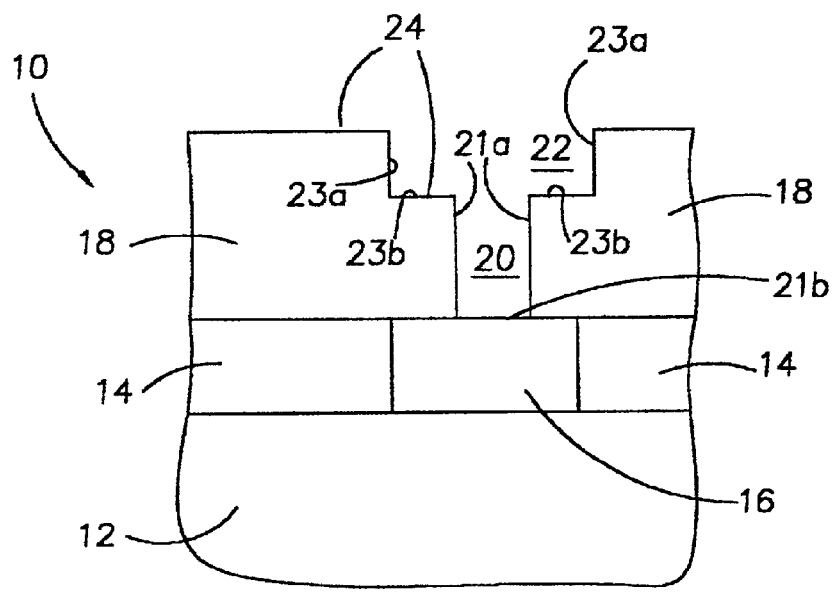

The second insulating layer 18 (e.g., SiOF) is patterned and etched to form dual inlaid openings that include a contact opening or via 20 and an interconnect channel or trench 22, resulting in the structure shown in FIG. 2C. Etching of the insulating layer 18 can be performed using known techniques, preferably by reactive ion etching (RIE). The contact opening 20 is etched through the second insulative layer 18 to extend to the underlying conductive layer 16. The contact opening 20 includes sidewalls 21*a* and a base portion 21*b*. The interconnect trench 22 is etched into the second insulative layer 18 to align with the contact opening 20 and form a channel from the contact opening 20 to other circuit elements (not shown). The interconnect trench 22 includes sidewalls 23*a* and a base portion 23*b*. The contact opening 20 can be patterned and etched first, followed by etching of the interconnect trench 22, or visa versa. The etch step can then followed by a resist strip step and a solvent clean step, as known and used in the art.

Figure 2D:
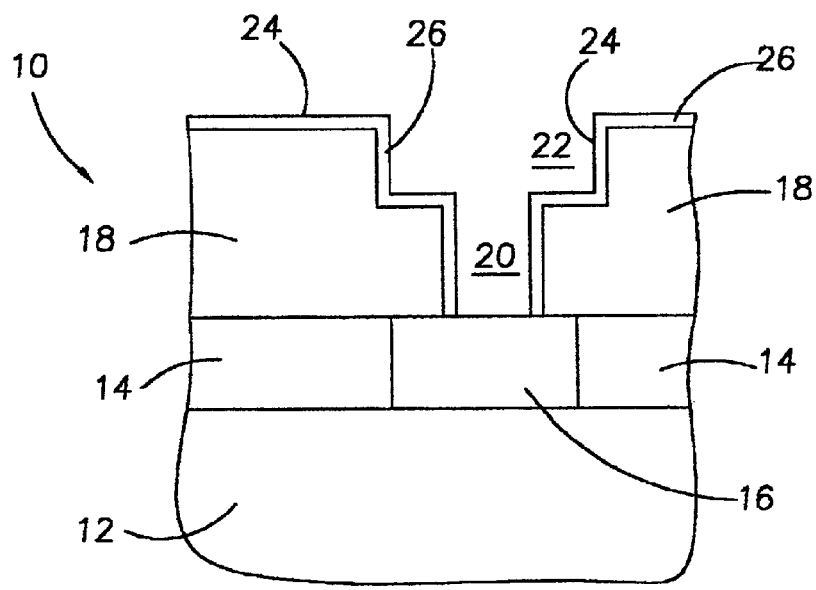

After the interconnect trench 22 and contact opening 20 are formed, the surface 24 of the insulating layer 18 (e.g., SiOF) is nitrided in situ using a nitrogen-comprising plasma. As depicted in FIG. 2D, the nitriding step converts a portion of the exposed surface 24 of the insulating (oxide) layer 18 (e.g., SiOF) to a nitrogen-comprising diffusion or barrier layer 26, for example, silicon oxynitride (SiON). The plasma nitriding step can be performed by exposing the insulating layer 18, for example, to ammonia ($NH_3$) and/or molecular nitrogen ($N_2$), to dope nitrogen into the insulating layer. Preferably, the thickness of the nitrogen-comprising barrier layer 26 (e.g., SiON) is about 5 to about 10 nm. The barrier layer 26 (e.g., SiON) functions as a barrier to suppress out-diffusion of copper atoms into the underlying insulating (oxide)-layer 18 (e.g., SiOF).

Such nitriding techniques are known in the art, for example, as described by Mikagi et al., the disclosure of which is incorporated by reference herein, whereby the nitriding step was performed by exposing the oxide insulating layer (e.g., SiOF) to an ammonia ($NH_3$) plasma at about 450° C. for about 30 minutes, resulting in a nitrogen-comprising barrier layer (e.g., SiON) having a thickness of about 10 nm.

Another nitriding technique is described in U.S. Pat. No. 5,821,168 (Jain), the disclosure of which is incorporated by reference herein. The step is performed by exposing the oxide insulating layer (e.g., SiOF) to a relatively high power plasma, e.g., ammonia ($NH_3$) and/or nitrogen ($N_2$), in a range of about 500 to about 1,500 watts, and a pressure of about 500 to about 2,000 mTorr, for about 1 to about 3 minutes to convert about 20 to about 30 nm of the exposed oxide layer (e.g., SiOF) into the nitrogen-comprising barrier layer (e.g., SiON).

Figure 2E:
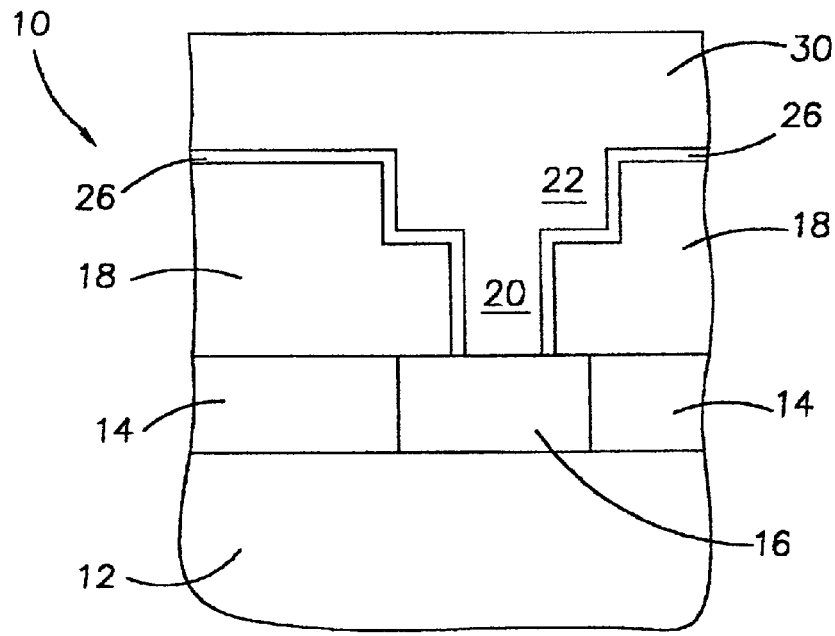

After the insulating layer 18 is nitrided, a copper layer 30 is deposited over the exposed surface 28 of the barrier layer 26 (e.g., SiON) to completely fill the interconnect trench 22 and the contact opening 20, resulting in the structure shown in FIG. 2E. According to the invention, the copper is deposited onto the trench 22 and contact opening 20 by sputtering, particularly ionized magnetron sputtering, also termed as ionized physical vapor deposition (I-PVD) and ion metal plasma (IMP) sputtering. Such sputtering techniques and process systems are well known in the art, as described, for example, in U.S. Pat. No. 5,985,759 (Kim), the disclosure of which is incorporated by reference herein. The resulting metal layer is a high purity copper with low electrical resistivity.

In a preferred method, the copper is deposited by ionized magnetron sputtering in which sputtered copper atoms are ionized by pass through an RF source to create a high density, inductively coupled RF plasma. Ionized magnetron sputtering achieves directional deposition of metals, and is preferred to fill 0.25 μm and smaller contact openings having a high aspect ratio of about 3:1 or greater.

In an exemplary ionized magnetron sputtering process using a conventional ionized PVD reactor (not shown), the wafer 10 is placed about 12 to about 15 cm (about 5 to about 6 inches) from a copper target cathode. The copper cathode is sputtered under a pressure of about 0.5 to about 5 mTorr by applying a DC power field to an inert gas, typically argon (Ar), over a range of about 0.5 to about 8 kW, preferably about 4 kW, resulting in the emission of copper atoms. RF power is applied to a 1 to 3-turn RF inductive coil in the area between the copper cathode and the wafer or other substrate. The RF power is applied to the coil at a frequency of about 1.9 or 13.5 MHz and a wattage of about 0.5 to about 6 kW, preferably about 1.5 to about 4 kW. The RF plasma is generated using an inert gas, typically argon (Ar) at a pressure of about 30 mTorr, to create a high density, inductively coupled RF plasma ($n_e > 10^{11}$ cm$^{-3}$). As the sputtered copper atoms pass through the RF plasma, about 50 to about 90%, preferably about 70 to about 90% of the sputtered copper atoms are ionized. The copper ions then deposited onto the exposed surface 28 of the barrier layer 26 and into the contact opening 20 and the trench 22.

Although the preferred process for forming the copper layer is by sputtering techniques, other means for producing copper atoms can be used. For example, copper evaporation techniques for vaporizing copper for deposition using a conventional metal evaporator, can be used. Such techniques are described, for example, in U.S. Pat. No. 4,944,961 (Lu) and U.S. Pat. No. 5,302,266 (Grabarz), the disclosures of which are incorporated by reference herein.

In general, metal evaporation uses a known method to heat the copper, including a heated filament, an electron gun, or RF induction. The metal evaporator has a port into a vacuum chamber where the wafer is placed. The copper is inserted into the metal evaporator, and the evaporator is heated to provide a steady flux of copper atoms through the port and into the vacuum chamber. The metal vapor is ionized by means of microwave energy, and the ions deposit as a layer on the exposed surface 28 of the barrier layer 26.

The deposited copper then undergoes-a-reflow processing step to ensure complete filling of narrow, high aspect ratio features. According to the invention, the deposited copper layer 30 is reflowed at a low temperature in an atmosphere of atomic hydrogen to fill the trench 22 and the contact hole 20.

A low temperature reflow is used to avoid the copper from closing over the trench/via and forming a void, and to ensure complete filling of the contact opening 20 and the bottom of the trench 22. To that end, the copper layer is reflowed at a temperature below about 400° C., preferably at about 300 to about 350° C., more preferably at about 320° C., for about 10 minutes.

The atomic hydrogen enhances the reflow of the copper into the contact opening and trench. The irradiation of the copper film by hydrogen atoms during the reflow process reduces the reflow temperature by more than about 100° C., and prevents void formation even in 0.15 μm trenches with an aspect ratio of 3:1. The method of the invention preferably utilizes an atomic hydrogen that is generated in a mixed high density krypton/hydrogen (Kr/H$_2$) plasma using a microwave-excitation high-density plasma system at a pressure of about 1 Torr and temperature of about 400° C. The mixing ratio of hydrogen to inert gas is preferably about 3 to about 5% (H$_2$/Kr).

Figure 2F:
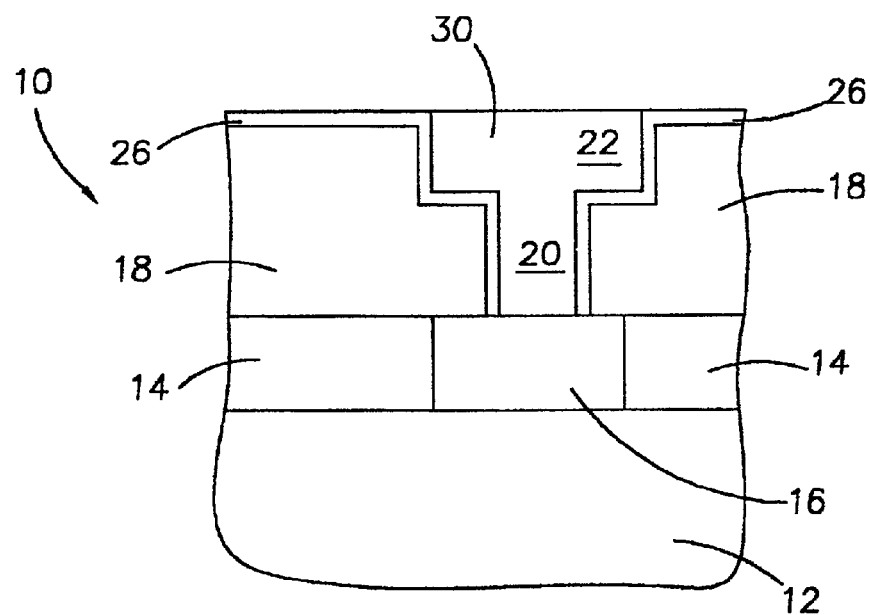

The reflowed copper layer 30 of FIG. 2E is then polished down so that the copper only lies within the contact opening 20 and the trench 22 to provide a planarized copper interconnect, as shown in FIG. 2F, and complete the dual damascene interconnect structure. The copper layer 30 can be polished using a convention Cu-chemical mechanical polishing (CMP) technique selective to oxide, as known and used in the art.

The process results in a dual inlaid structure that include both a via portion 20 and an interconnect channel portion 22, for providing electrical connection to various parts of the semiconductor device. A passivation layer (not shown) can then be formed over the device. Optionally, although not shown, other interconnect layers can be formed overlying the present structures. The foregoing process can also be modified to a single damascene process to form only interconnect channels 22.

Figure 3:
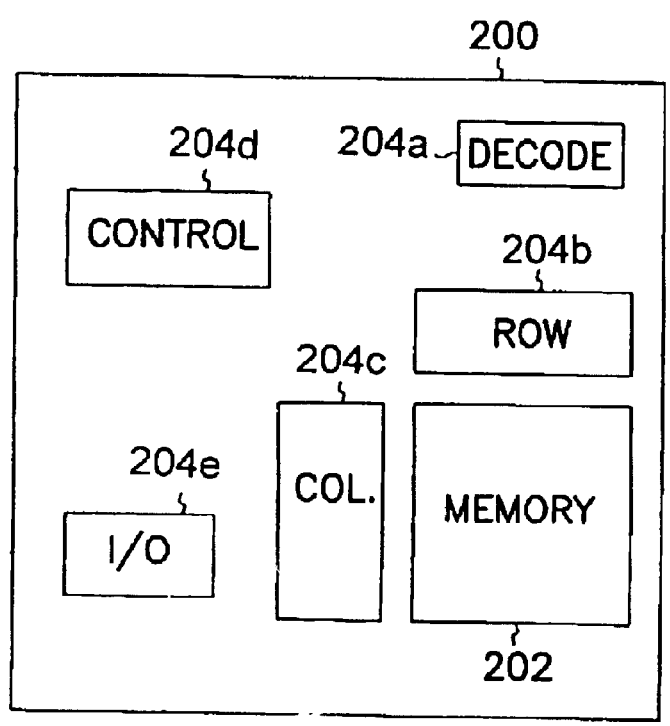
FIG. 3 is a depiction of a prior art block diagram of an integrated circuit memory device.

Depicted in FIG. 3 is an exemplary prior art simplified block diagram of a memory device 200 that includes an array of memory cells 202 and internal circuitry 204a–204e. The memory includes internal circuitry and metal contacts and interconnects which are coupled to the memory array and internal circuitry. The metal contacts and interconnects can comprise one or more generally horizontal conductive interconnect lines extending over an insulating layer overlying the memory array, and one or more generally vertical conductive contacts, whereby each interconnect line is coupled to at least one generally vertical conductive contact. The conductive interconnects and/or conductive contacts are formed from copper deposited by ionized sputtering over a non metal-comprising barrier layer overlying the surface of a contact opening, e.g., a trench opening extending over an insulating layer overlying the memory array and/or a contact opening extending vertically into the insulating layer. The deposited copper is preferably reflowed at a temperature less than about 400° C. in the presence of atomic hydrogen to fill the contact opening. The metal contacts and interconnects can be formed using a dual damascene process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor circuit, comprising:
   a semiconductor structure;
   an insulating layer over the semiconductor structure, the insulating layer having a contact opening extending therethrough to the semiconductor structure, wherein the contact opening has a surface and an aspect ratio of about 3:1 or greater wherein a diameter of the opening is about 0.25 μm or less;
   a non-metal barrier layer comprising silicon oxynitride over the insulating layer including the surface of the contact opening; whereby the barrier layer prevents diffusion of a copper-comprising material into the insulating layer; and
   a substantially void-less conductive contact within the contact opening over the barrier layer, and coupled to the semiconductor structure; the conductive contact comprising copper sputtered into the contact opening and reflowed at a temperature less than about 400° C. in the presence of atomic hydrogen.

2. The semiconductor circuit of claim 1, wherein the insulating layer comprises silicon oxyfluoride.

3. The semiconductor circuit of claim 1, wherein the barrier layer is about 5 nm to about 10 nm thick.

4. The semiconductor circuit of claim 1, wherein the copper comprises an ionized magnetron sputtered copper.

5. The semiconductor circuit of claim 1, wherein the atomic hydrogen is derived from a microwave-excited high density krypton/hydrogen plasma.

6. The semiconductor circuit of claim 1, further comprising: a conductive interconnect within a trench opening in the insulating layer over the barrier layer, and coupled to the conductive contact.

7. The semiconductor circuit of claim 6, wherein the conductive interconnect comprises copper sputtered into the trench opening and reflowed at a temperature less than about 400° C. in the presence of atomic hydrogen.

8. The semiconductor circuit of claim 6, wherein the conductive contact and the conductive interconnect are a dual damascene structure.

9. The circuit of claim 1, wherein the non-metal barrier layer comprises a nitrided surface of the insulating layer.

10. A semiconductor circuit, comprising:
   a semiconductor structure;
   an insulating layer over the semiconductor structure; the insulating having a plurality of generally vertical contact openings extending therethrough to contact locations on the semiconductor structure, and a plurality of generally horizontal trench openings extending over the insulating layer; each of the contact openings and trench openings having a surface and a non-metal barrier layer comprising silicon oxynitride hereon; one or more of the contact openings having an aspect ratio of about 3:1 or greater wherein a diameter of the opening is about 0.25 µm or less;
   a plurality of generally vertical and substantially void-less conductive contacts within the contact openings and coupled to the semiconductor structure, the conductive contacts comprising copper deposited by ionized sputtering into the contact opening over the barrier layer and reflowed at a temperature less than about 400° C. in the presence of atomic hydrogen to fill the contact opening; and
   a plurality of generally horizontal conductive interconnect lines within the trench openings, each of the interconnect lines coupled to at least one generally vertical conductive contact.

11. The semiconductor circuit of claim 10, wherein the conductive contacts and the conductive interconnects are a dual damascene structure.

12. The semiconductor circuit of claim 10, wherein the insulating layer comprises silicon oxyfluoride, and the barrier layer comprises an about 5 to about 10 nm thick layer of silicon oxynitride.

13. The semiconductor circuit of claim 10, wherein the atomic hydrogen is derived from a krypton/hydrogen plasma.

14. A semiconductor circuit, comprising:
   a semiconductor structure;
   an insulating layer over the semiconductor structure; the insulating having a plurality of generally vertical contact openings extending therethrough to contact locations on the semiconductor structure, and a plurality of generally horizontal trench openings extending over the insulating layer; each of the contact openings and trench openings having a surface and a non-metal barrier layer comprising silicon oxynitride thereon; one or more of the trench openings having an aspect ratio of about 3:1 or greater wherein a diameter of the opening is about 0.25 µm or less;
   a plurality of generally vertical conductive contacts within the contact openings and coupled to the semiconductor structure; and
   a plurality of generally horizontal and substantially void-less conductive interconnect lines within the trench openings, each of the interconnect lines coupled to at least one generally vertical conductive contact, the interconnect lines comprising copper deposited by ionized sputtering into the trench opening over the barrier layer and reflowed at a temperature less than about 400° C. in the presence of atomic hydrogen to fill the trench opening.

15. The semiconductor circuit of claim 14, wherein the atomic hydrogen is derived from a krypton/hydrogen plasma.

16. The semiconductor circuit of claim 14, wherein the conductive contacts and the conductive interconnects are a dual damascene structure.

17. A semiconductor circuit, comprising:
   a semiconductor structure;
   an insulating layer over the semiconductor structure; the insulating layer having a plurality of generally vertical contact openings extending therethrough to contact locations on the semiconductor structure, and a plurality of generally horizontal trench openings extending over the insulating layer; each of the contact openings and trench openings having a surface and a non-metal barrier layer comprising silicon oxynitride thereon; one or more of the contact openings, trench openings, or both, having an aspect ratio of about 3:1 or greater wherein a diameter of the opening is about 0.25 µm or less;
   a plurality of generally vertical and substantially void-less conductive contacts within the contact openings and coupled to the semiconductor structure; and
   a plurality of generally horizontal and substantially void-less conductive interconnect lines within the trench openings, each of the interconnect lines coupled to at least one generally vertical conductive contact;
   the conductive contacts and the interconnect lines comprising copper deposited by ionized sputtering into the trench opening over the barrier layer and reflowed at a temperature less than about 400° C. in the presence of atomic hydrogen to fill the contact opening and the trench opening.

18. The semiconductor circuit of claim 17, wherein the atomic hydrogen is derived from a krypton/hydrogen plasma.

19. The semiconductor circuit of claim 17, wherein the conductive contacts and the conductive interconnects are a dual damascene structure.

20. An integrated circuit memory device, comprising:
   an array of memory cells;
   internal circuitry; and
   metal contacts and interconnects coupled to the memory array and internal circuitry, the metal contacts and interconnects comprising:
   a plurality of generally vertical and substantially void-less conductive contacts disposed within a contact opening extending through an insulating layer overlying the memory array, at least one of the contact openings having an aspect ratio of about 3:1 or greater and a diameter of about 0.25 µm or less, each conductive contact comprising copper deposited by ionized sputtering into the contact opening over a non-metal barrier layer on a surface of a the contact opening and reflowed at a temperature less than about 400° C. in the presence of atomic hydrogen to fill the contact opening, the barrier layer comprising silicon oxynitride; and a plurality of generally horizontal conductive interconnect lines extending over the insulating layer, each of the interconnect lines coupled to at least one generally vertical conductive contact.

21. The integrated circuit memory device of claim 20, wherein the atomic hydrogen is derived from a krypton/hydrogen plasma.

22. The integrated circuit memory device of claim 20, wherein the metal contacts and interconnects are a dual damascene structure.

23. An integrated circuit memory device, comprising:
an array of memory cells;
internal circuitry; and
metal contacts and interconnects coupled to the memory array and internal circuitry, the metal contacts and interconnects comprising a plurality of generally horizontal conductive interconnect lines extending over the insulating layer overlying the memory array, each of the interconnect lines coupled to at least one generally vertical conductive contact; each conductive interconnect being substantially void-less and comprising copper deposited by ionized sputtering over a non-metal barrier layer on a surface of a trench opening extending over the insulating layer, and reflowed at a temperature less than about 400° C. in the presence of atomic hydrogen to fill the trench opening; the barrier layer comprising silicon oxynitride; and at least one of the trench openings having an aspect ratio of about 3:1 or greater and a diameter of about 0.25 µm or less.

24. The integrated circuit memory device of claim 17, wherein the atomic hydrogen is derived from a krypton/hydrogen plasma.

25. The integrated circuit memory device of claim 23, wherein the metal contacts and interconnects are a dual damascene structure.

26. An integrated circuit memory device, comprising:
an array of memory cells;
internal circuitry; and
substantially void-less conductive contacts and interconnects coupled to the memory cell array and internal circuitry, the conductive interconnect lines extending generally horizontally within a trench opening within an insulating layer overlying the memory cell array, each of the interconnect lines coupled to at least one conductive contact extending generally vertically within a contact opening extending through the insulating layer to the memory cell array;
each conductive contact and interconnect comprising copper deposited by ionized sputtering over a non-metal barrier layer on an exposed surface of the contact opening and the trench opening, and reflowed in the presence of atomic hydrogen to fill the trench opening and the contact opening; the barrier layer comprising silicon oxynitride; and at least one of said contact openings or trench openings having an aspect ratio of about 3:1 or greater and a diameter of about 0.25 µm or less.

27. The integrated circuit memory device of claim 26, wherein the atomic hydrogen is derived from a krypton/hydrogen plasma.

28. The integrated circuit memory device of claim 26, wherein the metal contacts and interconnects are a dual damascene structure.

29. A conductive contact in a semiconductor device, comprising: a substantially void-less sputter deposited copper contact disposed over a non-metal barrier layer lining an opening in an insulative layer disposed on a substrate, the barrier layer comprising silicon oxynitride; and the opening having an aspect ratio of about 3:1 or greater and a diameter of about 0.25 µm or less; the deposited copper being reflowed at a temperature of less than about 400° C.; whereby the barrier layer prevents diffusion of the copper into the insulative layer.

30. A conductive contact in a semiconductor device, comprising: a substantially void-less sputter deposited copper disposed over a non-metal barrier layer lining an opening in an insulative layer disposed on a substrate, the opening having an aspect ratio of about 3:1 or greater and a diameter of about 0.25 µm or less; the barrier layer comprising silicon oxynitride; and the deposited copper being reflowed at a temperature of about 400° C. to about 350° C.; whereby the barrier layer prevents diffusion of the copper into the insulative layer.

31. A conductive contact of a semiconductor device, the conductive contact disposed within an opening in an insulative layer having an aspect ratio of about 3:1 or greater and a diameter of about 0.25 µm or less, and comprising a substantially void-less sputter deposited and reflowed copper overlying a non-metal barrier layer lining the opening, the barrier layer comprising silicon oxynitride; and the deposited copper being reflowed at a temperature of less than about 400° C.; whereby the barrier layer prevents diffusion of the copper into the insulative layer.

32. The conductive contact of claim 31, wherein the insulative layer comprises a low k dielectric material.

33. A conductive contact of a semiconductor device, the conductive contact disposed within an opening in an insulative layer having an aspect ratio of about 3:1 or greater and a diameter of about 0.25 µm or less, and comprising a substantially void-less sputter deposited and reflowed copper overlying a nitrogen-comprising barrier layer lining the opening, the barrier layer comprising silicon oxynitride; and the deposited copper being reflowed at a temperature of less than about 400° C.; whereby the barrier layer prevents diffusion of the copper into the insulative layer.

34. A conductive contact of a semiconductor device, the conductive contact disposed within an opening in an insulative layer having an aspect ratio of about 3:1 or greater and a diameter of about 0.25 µm or less, and comprising a substantially void-less sputter deposited and reflowed copper fill overlying a silicon oxynitride barrier layer lining the opening, the deposited copper being reflowed at a temperature of less than about 400° C.; whereby the barrier layer prevents diffusion of the copper into the insulative layer.

35. A conductive contact of a semiconductor device, the conductive contact disposed within an opening in an insulative layer having an aspect ratio of about 3:1 or greater and a diameter of about 0.25 µm or less, and comprising a substantially void-less sputter deposited copper overlying a non-metal barrier layer lining the opening; the barrier layer comprising silicon oxynitride; and the copper deposited by ionized sputtering and reflowed at a temperature less than about 400° C. in the presence of atomic hydrogen; whereby the barrier layer prevents diffusion of the copper into the insulative layer.

36. A conductive contact of a semiconductor device, the conductive contact disposed within an opening in an insulative layer having an aspect ratio of about 3:1 or greater and a diameter of about 0.25 μm or less, and comprising a substantially void-less sputter deposited copper overlying a nitrogen-comprising barrier layer over the insulative layer within the opening; the barrier layer comprising silicon oxynitride; and the copper deposited by ionized sputtering and reflowed at a temperature less than about 400° C. in the presence of atomic hydrogen; whereby the barrier layer prevents diffusion of the copper into the insulative layer.

37. A conductive contact of a semiconductor device, the conductive contact disposed within an opening in an insulative layer having an aspect ratio of about 3:1 or greater and a diameter of about 0.25 μm or less, and comprising a substantially void-less reflowed, ionized magnetron sputtered copper overlying a non-metal barrier layer lining the opening; the barrier layer comprising silicon oxynitride; and the copper reflowed at a temperature less than about 400° C. in the presence of atomic hydrogen; whereby the barrier layer prevents diffusion of the copper into the insulative layer.

38. A conductive contact of a semiconductor device, the conductive contact disposed within an opening in a silicon oxyfluoride insulative layer having an aspect ratio of about 3:1 or greater and a diameter of about 0.25 μm or less, and comprising a substantially void-less reflowed, sputtered copper overlying a silicon oxynitride barrier layer over the silicon oxyfluoride insulative layer lining the opening, the deposited copper being reflowed at a temperature of less than about 400° C.; whereby the barrier layer prevents diffusion of the copper into the insulative layer.

39. A conductive contact of a semiconductor device, the conductive contact disposed within an opening in a silicon oxyfluoride insulative layer having an aspect ratio of about 3:1 or greater and a diameter of about 0.25 μm or less, and comprising a substantially void-less reflowed, ionized magnetron sputtered copper overlying a silicon oxynitride barrier layer over the silicon oxyfluoride insulative layer lining the opening; the deposited copper being reflowed at a temperature of less than about 400° C.; whereby the barrier layer prevents diffusion of the copper into the insulative layer.

40. A conductive contact of a semiconductor device, the conductive contact disposed within an opening in a silicon oxyfluoride layer having an aspect ratio of about 3:1 or greater and a diameter of about 0.25 μm or less, and comprising a substantially void-less reflowed, ionized magnetron sputtered copper overlying a silicon oxynitride barrier layer disposed over the silicon oxyfluoride insulative layer within the opening; the copper reflowed at a temperature less than about 400° C. in the presence of atomic hydrogen; whereby the barrier layer prevents diffusion of the copper into the insulative layer.

41. A conductive contact of a semiconductor device, the conductive contact disposed within an opening in a silicon oxyfluoride insulative layer having an aspect ratio of about 3:1 or greater and a diameter of about 0.25 μm or less, and comprising a substantially void-less copper fill overlying a silicon oxynitride barrier layer over the silicon oxyfluoride insulative layer within the opening; the copper fill comprising ionized magnetron sputtered copper reflowed at a temperature less than about 400° C. in the presence of atomic hydrogen; whereby the barrier layer prevents diffusion of the copper into the insulative layer.

42. A semiconductor device, comprising:
a conductive contact comprising a substantially void-less sputter deposited and reflowed copper fill disposed over a non-metal barrier layer lining an opening in an insulative layer disposed on a substrate, the barrier layer comprising silicon oxynitride; and the opening having an aspect ratio of about 3:1 or greater and a diameter of about 0.25 μm or less, the copper being reflowed at a temperature of less than about 400° C.; whereby the barrier layer prevents diffusion of a copper material into the insulating layer.

43. The semiconductor device of claim 42, wherein the insulative layer comprises a low k dielectric material.

44. The semiconductor device of claim 42, wherein the copper is an ionized sputtered copper.

45. A semiconductor device, comprising:
a conductive contact comprising a substantially void-less sputter deposited and reflowed copper fill overlying a nitrogen-comprising barrier layer lining an opening in an insulative layer on a substrate; the barrier layer having a thickness of up to 10 nm and comprising silicon oxynitride; and the opening having an aspect ratio of about 3:1 or greater and a diameter of about 0.25 μm or less, the copper being reflowed at a temperature less than about 400° C.; whereby the barrier layer prevents diffusion of the copper into the insulative layer.

46. A semiconductor device, comprising:
a conductive contact comprising a substantially void-less sputter deposited and reflowed copper fill overlying a silicon oxynitride barrier layer lining an opening in an insulative layer on a substrate, the opening having an aspect ratio of about 3:1 or greater and a diameter of about 0.25 μm or less, the copper being reflowed at a temperature of less than about 400° C.; whereby the barrier layer prevents diffusion of the copper into the insulative layer.

47. A semiconductor device, comprising:
a conductive contact comprising a substantially void-less sputter deposited copper fill disposed over a non-metal barrier layer lining an opening in an insulative layer on a substrate, the barrier layer comprising silicon oxynitride; and the opening having an aspect ratio of about 3:1 or greater and a diameter of about 0.25 μm or less, the copper deposited by ionized sputtering and reflowed at a temperature less than about 400° C. in the presence of atomic hydrogen; whereby the barrier layer prevents diffusion of the copper into the insulative layer.

48. A semiconductor device, comprising:
a conductive contact comprising a substantially void-less sputter deposited copper fill disposed over a nitrogen-comprising barrier layer lining an opening in an insulative layer on a substrate, the barrier layer comprising silicon oxynitride; and the opening having an aspect ratio of about 3:1 or greater and a diameter of about 0.25 μm or less; the copper deposited by ionized sputtering and reflowed at a temperature less than about 400° C. in the presence of atomic hydrogen; whereby the barrier layer prevents diffusion of the copper into the insulative layer.

49. A semiconductor device, comprising:
a conductive contact comprising a substantially void-less sputter deposited copper fill disposed over a nitrogen-comprising barrier layer lining an opening in an insulative layer on a substrate, the barrier layer comprising silicon oxynitride; and the opening having an aspect ratio of about 3:1 or greater and a diameter of about 0.25 μm or less; the copper deposited by ionized sputtering and reflowed at a temperature less than about 400° C. in the presence of atomic hydrogen from a high density plasma source of krypton/hydrogen; whereby the barrier layer prevents diffusion of the copper into the insulative layer.

50. A semiconductor device, comprising:

a conductive contact disposed within an opening in an insulative layer having an aspect ratio of about 3:1 or greater and a diameter of about 0.25 μm or less, the conductive contact comprising a substantially void-less reflowed, ionized magnetron sputtered copper fill overlying a non-metal barrier layer lining the opening; the copper reflowed at a temperature less than about 400° C. in the presence of atomic hydrogen; whereby the barrier layer comprises silicon oxynitride, and prevents diffusion of the copper into the insulative layer.

51. A semiconductor device, comprising:

a conductive contact disposed within an opening in an insulative layer having an aspect ratio of about 3:1 or greater and a diameter of about 0.25 μm or less, the contact comprising a substantially void-less copper fill disposed over a nitrogen-comprising barrier layer over the insulative layer within the opening; the barrier layer comprising silicon oxynitride; and the copper fill comprising ionized magnetron sputtered copper reflowed at a temperature less than about 400° C. in the presence of atomic hydrogen; whereby the barrier layer prevents diffusion of the copper into the insulative layer.

52. A semiconductor device, comprising:

a conductive contact disposed within an opening in an insulative layer having an aspect ratio of about 3:1 or greater and a diameter of about 0.25 μm or less, and comprising a substantially void-less copper fill disposed over a nitrogen-comprising barrier layer over the insulative layer within the opening; the barrier layer comprising silicon oxynitride; and the copper fill comprising ionized magnetron sputtered copper reflowed at a temperature less than about 400° C. in the presence of atomic hydrogen from a high density plasma source of krypton/hydrogen; whereby the barrier layer prevents diffusion of the copper into the insulative layer.

53. A semiconductor device, comprising:

a conductive contact disposed within an opening in an insulative layer having an aspect ratio of about 3:1 or greater and a diameter of about 0.25 μm or less, and comprising a substantially void-less copper fill disposed over a nitrogen-comprising barrier layer over the insulative layer within the opening; the barrier layer comprising silicon oxynitride; and the copper fill comprising ionized magnetron sputtered copper reflowed in atomic hydrogen derived from a microwave excited high density plasma source of krypton/hydrogen at a temperature of less than about 400° C.; whereby the barrier layer prevents diffusion of the copper into the insulating layer.

54. A semiconductor circuit, comprising:

a substrate comprising a semiconductor structure disposed thereon, an insulative layer overlying the semiconductor structure and having an opening therethrough to the semiconductor structure, the opening having an aspect ratio of about 3:1 or greater and a diameter of about 0.25 μm or less; a conductive contact disposed within the opening and comprising a substantially void-less sputter deposited and reflowed copper fill overlying a non-metal barrier layer on the insulative layer within the opening, the barrier layer comprising silicon oxynitride; and the copper fill being reflowed at a temperature less than about 400° C.; whereby the barrier layer prevents diffusion of the copper into the insulative layer.

55. A semiconductor circuit, comprising:

a substrate comprising a semiconductor structure disposed thereon, an insulative layer overlying the semiconductor structure and having an opening therethrough to the semiconductor structure, the opening having an aspect ratio of about 3:1 or greater and a diameter of about 0.25 μm or less; a conductive contact disposed within the opening and comprising a substantially void-less sputter deposited and reflowed copper fill overlying a non-metal barrier layer on the insulative layer within the opening, the barrier layer comprising silicon oxynitride; and the copper fill being reflowed at a temperature of about 300° C. to about 350° C.; whereby the barrier layer prevents diffusion of the copper into the insulative layer.

56. A semiconductor circuit, comprising:

a substrate comprising a semiconductor structure disposed thereon, an insulative layer overlying the semiconductor structure and having an opening therethrough to the semiconductor structure, the opening having an aspect ratio of about 3:1 or greater and a diameter of about 0.25 μm or less; a conductive contact disposed within the opening and comprising a substantially void-less sputter deposited and reflowed copper fill overlying a nitrogen-comprising barrier layer on the insulative layer within the opening, the barrier layer comprising silicon oxynitride; and the copper fill being reflowed at a temperature of less than about 400° C.; whereby the barrier layer prevents diffusion of the copper into the insulative layer.

57. A semiconductor circuit, comprising:

a substrate comprising a semiconductor structure disposed thereon, an insulative layer overlying the semiconductor structure and having an opening therethrough to the semiconductor structure, the opening having an aspect ratio of about 3:1 or greater and a diameter of about 0.25 μm or less; a conductive contact disposed within the opening and comprising a substantially void-less sputter deposited copper fill overlying a non-metal barrier layer on the insulative layer within the opening; the barrier layer comprising silicon oxynitride; and the copper deposited by ionized sputtering and reflowed at a temperature less than about 400° C. in the presence of atomic hydrogen; whereby the barrier layer prevents diffusion of the copper into the insulative layer.

58. A semiconductor circuit, comprising:

a substrate comprising a semiconductor structure disposed thereon, an insulative layer overlying the semiconductor structure and having an opening therethrough to the semiconductor structure, the opening having an aspect ratio of about 3:1 or greater and a diameter of about 0.25 μm or less; a conductive contact disposed within the opening and comprising a substantially void-less sputter deposited copper fill overlying a non-metal barrier layer on the insulative layer within the opening; the barrier layer comprising silicon oxynitride; and the copper deposited by ionized sputtering and reflowed at a temperature less than about 400° C. in the presence of atomic hydrogen from a high density plasma source of krypton/hydrogen; whereby the barrier layer prevents diffusion of the copper into the insulative layer.

59. A semiconductor circuit, comprising:

a substrate comprising a semiconductor structure disposed thereon, an insulative layer overlying the semiconductor structure and having an opening therethrough to the semiconductor structure, the opening having an aspect ratio of about 3:1 or greater and a diameter of about 0.25 µm or less; a conductive contact disposed within the opening, and comprising a substantially void-less ionized magnetron sputtered copper fill overlying a non-metal barrier layer on the insulative layer within the opening; the barrier layer comprising silicon oxynitride; and the copper fill reflowed at a temperature less than about 400° C. in the presence of atomic hydrogen from a high density plasma source of krypton/hydrogen; whereby the barrier layer prevents diffusion of the copper into the insulative layer.

60. A semiconductor circuit, comprising:

a substrate comprising one or more semiconductor structures disposed thereon, an insulative layer overlying the one or more semiconductor structures and having one or more openings therethrough to at least one of the one or more semiconductor structures, at least one of the openings having an aspect ratio of about 3:1 or greater and a diameter of about 0.25 µm or less with a conductive contact disposed therein comprising a substantially void-less sputter deposited and reflowed copper fill overlying a non-metal barrier layer on the insulative layer within the opening, the barrier layer comprising silicon oxynitride; and the copper fill being reflowed at a temperature of less than about 400° C.; whereby the barrier layer prevents diffusion of the copper into the insulative layer.

61. A semiconductor circuit, comprising:

a substrate comprising one or more semiconductor structures disposed thereon; an insulative layer overlying the one or more semiconductor structures, and having a plurality of openings therethrough to at least one of the one or more semiconductor structures and at least one trench extending from at least one opening over the insulative layer; at least one of the openings, the trench, or both, having an aspect ratio of about 3:1 or greater and a diameter of about 0.25 µm or less;

a substantially void-less sputtered and reflowed copper fill overlying a non-metal barrier layer on the insulative layer within the openings and the at least one trench, the barrier layer comprising silicon oxynitride; and the copper fill being reflowed at a temperature of less than about 400° C.; whereby the barrier layer prevents diffusion of the copper into the insulative layer.

62. A semiconductor circuit, comprising:

a substrate comprising one or more semiconductor structures disposed thereon; an insulative layer overlying the one or more semiconductor structures, and having a plurality of openings therethrough to at least one of the one or more semiconductor structures and at least one trench extending from at least one opening over the insulative layer; at least one of the openings, the trench, or both, having an aspect ratio of about 3:1 or greater and a diameter of about 0.25 µm or less;

a substantially void-less sputtered and reflowed copper fill overlying a non-metal barrier layer on the insulative layer within the openings and the at least one trench, the barrier layer comprising silicon oxynitride; and the copper fill being reflowed at a temperature of less than about 400° C.; whereby the barrier layer prevents diffusion of the copper into the insulative layer.

63. A semiconductor circuit, comprising:

a substrate comprising one or more semiconductor structures disposed thereon; an insulative layer overlying the one or more semiconductor structures, and having a plurality of openings therethrough to at least one of the one or more semiconductor structures and at least one trench, extending from at least one opening over the insulative layer; at least one of the openings, the trench, or both, having an aspect ratio of about 3:1 or greater and a diameter of about 0.25 µm or less;

a substantially void-less sputtered copper fill overlying a nitrogen-comprising barrier layer on the insulative layer within the openings and the at least one trench, the barrier layer comprising silicon oxynitride; and the copper fill being reflowed at a temperature of less than about 400° C.; whereby the barrier layer prevents diffusion of the copper into the insulative layer.

64. A semiconductor circuit, comprising:

a substrate comprising one or more semiconductor structures disposed thereon; an insulative layer overlying the one or more semiconductor structures, and having a plurality of openings therethrough to at least one of the one or more semiconductor structures and at least one trench extending from at least one opening over the insulative layer; at least one of the openings, the trench, or both, having an aspect ratio of about 3:1 or greater and a diameter of about 0.25 µm or less;

a substantially void-less sputtered copper fill overlying a non-metal barrier layer on the insulative layer within the openings and the at least one trench; the barrier layer comprising silicon oxynitride; and the copper deposited by ionized sputtering and reflowed at a temperature less than about 400° C. in the presence of atomic hydrogen; whereby the barrier layer prevents diffusion of the copper into the insulative layer.

65. A semiconductor circuit, comprising:

a substrate comprising one or more semiconductor structures disposed thereon; an insulative layer overlying the one or more semiconductor structures, and having a plurality of openings therethrough to at least one of the one or more semiconductor structures and at least one trench extending from at least one opening over the insulative layer, at least one of the openings, the trench, or both, having an aspect ratio of about 3:1 or greater and a diameter of about 0.25 µm or less; and a substantially void-less conductive fill overlying a non-metal barrier layer on the insulative layer within the openings and the at least one trench; the barrier layer comprising silicon oxynitride; and the conductive fill comprising an ionized magnetron sputtered copper fill reflowed at a temperature less than about 400° C. in the presence of atomic hydrogen from a high density plasma source of krypton/hydrogen; whereby the barrier layer prevents diffusion of the copper into the insulative layer.

66. An integrated circuit memory device, comprising:

an array of memory cells;

internal circuitry; and substantially void-less conductive contacts and interconnects coupled to the memory array and internal circuitry, the conductive contacts and interconnects comprising sputter deposited and reflowed copper disposed over a non-metal barrier layer lining openings in an insulative layer disposed on a substrate, at least one of the openings having an aspect ratio of about 3:1 or greater and a diameter of about 0.25 µm or less, the barrier layer comprising silicon oxynitride; and the copper being reflowed at a temperature of less than about 400° C.; whereby the barrier layer prevents diffusion of the copper into the insulative layer.

67. An integrated circuit memory device, comprising:
an array of memory cells;
internal circuitry; and
substantially void-less conductive contacts and interconnects coupled to the memory array and internal circuitry, the conductive contacts and interconnects comprising sputter deposited and reflowed copper disposed over a nitrogen-comprising barrier layer lining openings in an insulative layer disposed on a substrate, at least one of the openings having an aspect ratio of about 3:1 or greater and a diameter of about 0.25 $\mu$m or less, the barrier layer comprising silicon oxynitride, and the copper being reflowed at a temperature of less than about 400° C.; whereby the barrier layer prevents diffusion of the copper into the insulative layer.

68. An integrated circuit memory device, comprising:
an array of memory cells;
internal circuitry; and
substantially void-less conductive contacts and interconnects coupled to the memory array and internal circuitry, the conductive contacts and interconnects comprising sputter deposited and reflowed copper disposed over a non-metal barrier layer lining openings in an insulative layer disposed on a substrate, at least one of the openings having an aspect ratio of about 3:1 or greater and a diameter of about 0.25 $\mu$m or less, the barrier layer comprising silicon oxynitride, and the copper deposited by ionized sputtering and reflowed at a temperature less than about 400° C. in the presence of atomic hydrogen; whereby the barrier layer prevents diffusion of the copper into the insulative layer.

69. An integrated circuit memory device, comprising:
an array of memory cells;
internal circuitry; and
substantially void-less conductive contacts and interconnects coupled to the memory array and internal circuitry, the conductive contacts and interconnects comprising sputter deposited and reflowed copper disposed over a non-metal barrier layer lining openings in an insulative layer disposed on a substrate, at least one of the openings having an aspect ratio of about 3:1 or greater and a diameter of about 0.25 $\mu$m or less; the barrier layer comprising silicon oxynitride; and the copper deposited by ionized sputtering and reflowed at a temperature less than about 400° C. in the presence of atomic hydrogen from a high density plasma source of krypton/hydrogen; whereby the barrier layer prevents diffusion of the copper into the insulative layer.

70. An integrated circuit memory device, comprising:
an array of memory cells;
internal circuitry; and
substantially void-less conductive contacts and interconnects coupled to the memory array and internal circuitry, the conductive contacts and interconnects comprising sputter deposited and reflowed copper disposed over a non-metal barrier layer lining openings in an insulative layer disposed on a substrate, at least one of the openings having an aspect ratio of about 3:1 or greater and a diameter of about 0.25 $\mu$m or less; the barrier layer comprising silicon oxynitride; and the copper deposited by ionized sputtering and reflowed at a temperature less than about 400° C. in the presence of atomic hydrogen; whereby the barrier layer prevents diffusion of the copper into the insulative layer.

71. A substantially void-less contact comprising sputtered and atomic hydrogen reflowed copper disposed over a non-metal barrier material layer lining an opening in an insulating layer having a diameter of about 0.25 $\mu$m or less and an aspect ratio of about 3:1 or greater, the barrier layer comprising silicon oxynitride; and effective to prevent diffusion of copper therethrough.

72. A contact comprising a substantially void-less sputtered and atomic hydrogen reflowed copper fill within an opening and on a nitrided surface of an insulating layer, the opening having a diameter of about 0.25 $\mu$m or less and an aspect ratio of about 3:1 or greater, and the nitrided surface providing a non-metal barrier material layer comprising silicon oxynitride and effective to prevent diffusion of copper therethrough into the insulating layer.

73. The contact of claim 72, wherein the insulating layer comprises silicon oxyfluoride.

74. The contact of claim 73, wherein the barrier material is about 5 nm to about 10 nm thick.

75. A semiconductor device comprising an insulative layer having a surface and an opening with a diameter of about 0.25 $\mu$m or less and an aspect ratio of about 3:1 or greater, the surface of the insulative layer within the opening comprising a non-metal barrier material layer effective to prevent copper diffusion therethrough, the barrier layer comprising silicon oxynitride; and a substantially void-less contact comprising a sputtered and atomic hydrogen reflowed copper fill over the barrier material within the opening.

76. A semiconductor device comprising a substantially void-less contact within an opening in an insulative layer and disposed over a non-metal barrier material effective to prevent diffusion of copper therethrough into the insulative layer, the opening having a diameter of about 0.25 $\mu$m or less and an aspect ratio of about 3:1 or greater, the barrier layer comprising silicon oxynitride, and the contact comprising sputtered and atomic hydrogen reflowed copper.

77. A semiconductor device comprising a substantially void-less contact within an opening in an insulative layer and disposed over a barrier layer disposed over the insulative layer, the barrier layer comprising silicon oxynitride and a nitrided surface of the insulative layer wherein the barrier layer is effective to prevent diffusion of copper therethrough into the insulating layer; the opening having a diameter of about 0.25 $\mu$m or less and an aspect ratio of about 3:1 or greater, and the contact comprising sputtered and atomic hydrogen reflowed copper.

78. A semiconductor device, comprising: an opening in an insulating layer having a diameter of about 0.25 $\mu$m or less and an aspect ratio of about 3:1 or greater, a non-metal barrier material lining the opening and effective to prevent diffusion of copper therethrough, the barrier layer comprising silicon oxynitride; and a substantially void-less, sputtered and atomic hydrogen reflowed copper fill disposed over the barrier material within the opening.

79. A semiconductor device, comprising: a trench in an insulating layer having a diameter of about 0.25 $\mu$m or less and an aspect ratio of about 3:1 or greater, a non-metal barrier material lining the trench and effective to prevent diffusion of copper therethrough, the barrier layer comprising silicon oxynitride; and a substantially void-less, sputtered and atomic hydrogen reflowed copper fill disposed over the barrier material within the trench.

80. A semiconductor circuit, comprising: a substantially void-less contact comprising sputtered and atomic hydrogen reflowed copper disposed over a non-metal barrier material lining an opening of an insulating layer having a diameter of about 0.25 μm or less and an aspect ratio of about 3:1 or greater, the barrier material comprising silicon oxynitride and effective to prevent diffusion of copper therethrough.

81. A memory device, comprising: a memory cell, circuitry, and a substantially void-less contact connected to the memory cell and circuitry, the contact comprising sputtered and atomic hydrogen reflowed copper disposed over a non-metal barrier material lining an opening of an insulating layer having a diameter of about 0.25 μm or less and an aspect ratio of about 3:1 or greater, the barrier material comprising silicon oxynitride and effective to prevent diffusion of copper therethrough.

82. A damascene structure, comprising:
   a substrate;
   an insulative layer over the substrate;
   a contact opening in the insulative layer filled with a substantially void-less conductive material comprising sputtered and atomic hydrogen reflowed copper, a non-metal barrier material comprising silicon oxynitride and interposed between the conductive material and the insulative layer and effective to prevent diffusion of copper therethrough, the opening having a diameter of about 0.25 μm or less and an aspect ratio of about 3:1 or greater; and
   a trench filled with a conductive material extending to the conductive material within the contact opening.

83. A damascene structure, comprising:
   a substrate;
   an insulative layer over the substrate;
   a contact opening in the insulative layer filled with a conductive material; and
   a trench in the insulative layer filed filled with a substantially void-less conductive material comprising sputtered and atomic hydrogen reflowed copper extending to the conductive material within the contact opening, a non-metal barrier material comprising silicon oxynitride and interposed between the conductive material and the insulative layer and effective to prevent diffusion of copper therethrough, the trench having a diameter of about 0.25 μm or less and an aspect ratio of about 3:1 or greater.

84. A damascene structure, comprising:
   a substrate;
   an insulative layer over the substrate;
   a contact opening in the insulative layer filled with a conductive material; and
   a trench in the insulative layer filled with a conductive material extending to the conductive material within the contact opening;
   the conductive material within the contact opening and the trench being substantially void-less and comprising sputtered and atomic hydrogen reflowed copper, a non-metal barrier material comprising silicon oxynitride and interposed between the conductive material and the insulative layer and effective to prevent diffusion of copper therethrough, at least one of the contact opening and the trench having a diameter of about 0.25 μm or less and an aspect ratio of about 3:1 or greater.

85. A damascene structure, comprising: an insulative layer with an opening formed therethrough and a trench formed within the insulative layer and extending to the opening, at least one of the opening and the trench having a diameter of about 0.25 μm or less and an aspect ratio of about 3:1 or greater, a non-metal barrier material comprising silicon oxynitride and lining the opening and the trench and effective to prevent diffusion of copper therethrough, and the opening and the trench filled with a substantially void-less conductive material comprising sputtered and atomic hydrogen reflowed copper.

86. A damascene structure, comprising: an opening in an insulative layer and a trench in the insulative layer and extending to the opening, at least one of the opening and the trench having a diameter of about 0.25 μm or less and an aspect ratio of about 3:1 or greater, a non-metal barrier material comprising silicon oxynitride and lining the opening and the trench and effective to prevent diffusion of copper therethrough, and a substantially void-less sputtered and atomic hydrogen reflowed copper fill disposed over the barrier material within the opening and the trench.

87. A memory device in an integrated circuit, comprising an opening in an insulating layer having a diameter of about 0.25 μm or less and an aspect ratio of about 3:1 or greater, a non-metal barrier material comprising silicon oxynitride and lining the opening and effective to prevent diffusion of copper therethrough, and a substantially void-less sputtered and atomic hydrogen reflowed copper fill disposed over the barrier material within the opening.

88. A memory device in an integrated circuit, comprising a trench in an insulating layer having a diameter of about 0.25 μm or less and an aspect ratio of about 3:1 or greater, a non-metal barrier material comprising silicon oxynitride and lining the trench and effective to prevent diffusion of copper therethrough, and a substantially void-less, sputtered and atomic hydrogen reflowed copper fill disposed over the barrier material within the trench.

89. A microprocessor, comprising:
   an integrated circuit comprising a substantially void-less contact comprising sputtered and atomic hydrogen reflowed copper disposed over a non-metal barrier material comprising silicon oxynitride and lining an opening in an insulating layer having a diameter of about 0.25 μm or less and an aspect ratio of about 3:1 or greater, the barrier material effective to prevent diffusion of copper therethrough.

90. A microprocessor, comprising:
   an integrated circuit comprising a substantially void-less interconnect comprising sputtered and atomic hydrogen reflowed copper disposed over a non-metal barrier material comprising silicon oxynitride and lining an opening in an insulating layer having a diameter of about 0.25 μm or less and an aspect ratio of about 3:1 or greater, the barrier material effective to prevent diffusion of copper therethrough.

91. A microprocessor, comprising:
   an integrated circuit comprising a damascene structure, the damascene structure comprising an insulative layer with an opening formed therethrough and a trench formed within the insulative layer and extending to the opening, at least one of the opening and the trench having a diameter of about 0.25 μm or less and an aspect ratio of about 3:1 or greater, a non-metal barrier material comprising silicon oxynitride and lining the opening and the trench and effective to prevent diffusion of copper therethrough, and the opening and the trench filled with a substantially void-less conductive material comprising sputtered and atomic hydrogen reflowed copper.

92. A non-metal barrier layer interposed between a copper fill and an insulative layer, the barrier layer comprising silicon oxynitride and a nitrided portion of the insulative layer effective to prevent diffusion of copper therethrough, the copper fill being substantially void-less and comprising sputtered and atomic hydrogen reflowed copper, the copper fill disposed in an opening in the insulative layer having a diameter of about 0.25 µm or less and an aspect ratio of about 3:1 or greater.

93. The barrier layer of claim 92, wherein the insulative layer comprises silicon oxyfluoride.

94. The barrier layer of claim 92, wherein the barrier layer has a thickness of about 5 nm to about 10 nm.

* * * * *